(12) United States Patent
Liang

(10) Patent No.: US 8,033,621 B2
(45) Date of Patent: Oct. 11, 2011

(54) ULTRATHIN SLIDE RAIL CAPABLE OF RAPID INSTALLATION AND REMOVAL

(75) Inventor: Chien-Fa Liang, Chung-Ho (TW)

(73) Assignee: Ablecom Technology Incorporation, Taipei County (TW)

( * ) Notice: Subject to any disclaimer, the term of this patent is extended or adjusted under 35 U.S.C. 154(b) by 0 days.

(21) Appl. No.: 12/268,820

(22) Filed: Nov. 11, 2008

(65) Prior Publication Data

US 2011/0091141 A1    Apr. 21, 2011

(30) Foreign Application Priority Data

Oct. 16, 2008    (TW) ................................. 97139648 A

(51) Int. Cl.
A47B 88/00    (2006.01)

(52) U.S. Cl. .................................. 312/334.4; 312/334.5

(58) Field of Classification Search ............ 384/21, 384/22; 312/223.1, 265.1–265.4, 334.5, 312/334.4, 334.1, 334.7, 334.8, 333, 319.1; 411/388, 398

See application file for complete search history.

(56) References Cited

U.S. PATENT DOCUMENTS

| | | | | |
|---|---|---|---|---|
| 5,312,005 | A * | 5/1994 | Odell .............................. 211/189 |
| 5,571,256 | A * | 11/1996 | Good et al. ........................ 211/26 |
| 5,833,337 | A * | 11/1998 | Kofstad ........................ 312/334.5 |
| 6,223,908 | B1 * | 5/2001 | Kurtsman ......................... 211/26 |
| 6,230,903 | B1 * | 5/2001 | Abbott ............................. 211/26 |
| 6,422,399 | B1 * | 7/2002 | Castillo et al. ................... 211/26 |
| 6,554,142 | B2 * | 4/2003 | Gray ................................ 211/26 |
| 6,578,939 | B1 * | 6/2003 | Mayer ......................... 312/334.5 |
| 6,609,619 | B2 * | 8/2003 | Abbott ............................. 211/26 |
| 6,685,033 | B1 * | 2/2004 | Baddour et al. .................. 211/26 |
| 6,702,412 | B2 * | 3/2004 | Dobler et al. ............... 312/334.5 |
| 6,840,388 | B2 * | 1/2005 | Mayer ............................. 211/26 |
| 6,948,691 | B2 * | 9/2005 | Brock et al. ............... 248/222.13 |
| 6,974,037 | B2 * | 12/2005 | Haney .............................. 211/26 |
| 7,263,953 | B2 * | 9/2007 | Sundararajan ................ 119/719 |
| 7,357,362 | B2 * | 4/2008 | Yang et al. ............... 248/221.11 |
| 7,641,297 | B2 * | 1/2010 | Huang ........................ 312/334.4 |
| 7,780,253 | B1 * | 8/2010 | Lu ............................... 312/334.4 |
| 2001/0040142 | A1 * | 11/2001 | Haney ........................... 211/183 |
| 2003/0071548 | A1 * | 4/2003 | Milligan .................. 312/334.11 |
| 2003/0234602 | A1 * | 12/2003 | Cutler et al. .................. 312/333 |
| 2004/0079712 | A1 * | 4/2004 | Mayer ............................. 211/26 |
| 2004/0227441 | A1 * | 11/2004 | Wang et al. .................. 312/334.8 |
| 2005/0052102 | A1 * | 3/2005 | Lauchner ................... 312/334.5 |
| 2005/0156493 | A1 * | 7/2005 | Yang et al. ................. 312/334.5 |
| 2006/0157436 | A1 * | 7/2006 | Iwamoto ....................... 211/191 |
| 2008/0073469 | A1 * | 3/2008 | Mushan et al. ............. 248/205.1 |

* cited by examiner

*Primary Examiner* — Janet M Wilkens
(74) *Attorney, Agent, or Firm* — Jackson IPG PLLC; Demian K. Jackson

(57) ABSTRACT

A pair of ultrathin slide rails capable of rapid installation and removal are disclosed. The slide rails are specially configured to provide an ultrathin three-section slide rail mechanism. Switchable auxiliary pins are inserted into threaded holes formed in bent sections at both ends of each slide rail, allowing the slide rails to be rapidly positioned in positioning holes of slide rail posts of a chassis and secured in place by fastening screws. The fastening screws are replaceable by resilient fasteners provided on the bent sections at both ends of each slide rail so that the slide rails can be rapidly installed and removed by virtue of the resilient fasteners and the auxiliary pins.

2 Claims, 4 Drawing Sheets

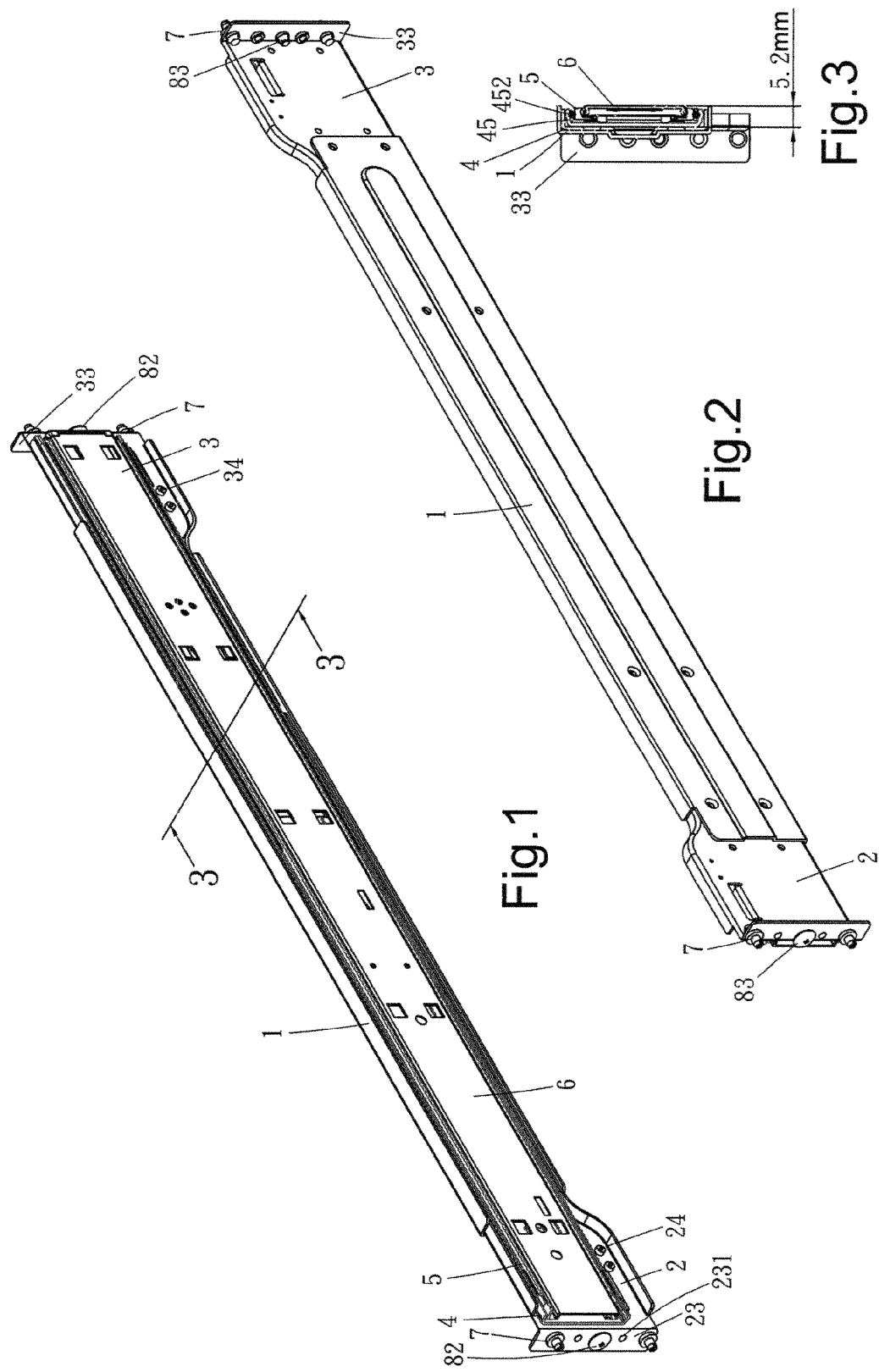

ULTRATHIN SLIDE RAIL CAPABLE OF RAPID INSTALLATION AND REMOVAL

BACKGROUND OF THE INVENTION

1. Technical Field

The present invention relates to slide rails, and more particularly, to ultrathin slide rails which are capable of rapid installation and removal and are designed particularly for being installed in the chassis of computers, electric appliances or medical equipment. The slide rails are specially configured to provide an ultrathin three-section slide rail mechanism such that rapid installation and removal of the slide rails are achievable through auxiliary pins and resilient fasteners.

2. Description of Related Art

Slide rails are commonly used with a variety of apparatuses, such as industrial computers, servers and control devices of electric appliances, to provide operational flexibility and efficient use of space while enabling easy expansion or maintenance. For an apparatus to use slide rails, symmetric slide rail posts are generally built in a chassis of the apparatus, so that plural sets of symmetric slide rails, along with hosts (e.g., industrial computers) secured thereon, can be installed across the corresponding slide rail posts in such a way that contraction or extension of the two- or three-section slide rails allows the laterally or vertically stacked hosts to be pushed into the chassis for use or pulled out therefrom for expansion, replacement, inspection or maintenance.

A pair of conventional slide rails are each composed of a set of inner and outer rail sections that are contractible and extensible for adjusting a length of each slide rail In consideration of the extended length and structural strength of the slide rails, a two- or three-section slide rail typically has an overall thickness of about 12.7 to 13 mm. However, a slide rail according to the present invention that is capable of full extension has a combined core thickness of only about 5.2 to 5.8 mm. Practically speaking, a pair of thinner slide rails not only save more room for use, but are also more advantageous during manufacture, storage or transportation.

In addition, the conventional slide rails are generally secured to the slide rail posts of a chassis either by screws passing through bent sections formed at both ends of the slide rails and the slide rail posts, or by fastening blocks which fasten the slide rails to fastening holes of the slide rail posts, so that hosts secured on the slide rails are allowed to slide into or out of the chassis as described above.

BRIEF SUMMARY OF THE INVENTION

In view of the shortcomings of the conventional slide rails regarding thickness and installation, an ultrathin slide rail capable of rapid installation and removal was successfully developed by the inventor of the present invention as disclosed herein.

The ultrathin slide rail capable of rapid installation and removal according to the present invention has the following three major features. First, the slide rail is specially configured to provide an ultrathin three-section slide rail mechanism. Second, the slide rail is provided with switchable auxiliary pins which can be inserted into threaded holes of bent sections formed at both ends of each slide rail and be switched according to the types of fastening holes on slide rail posts, so that the slide rail can be rapidly positioned in positioning holes of the slide rail posts and secured in place by fastening screws. In practice, the fastening screws can be replaced by resilient fasteners disposed at the bent sections at both ends of the slide rail, wherein the resilient fasteners work together with the auxiliary pins to enable rapid installation and removal of the slide rail. Third, a reinforcing plate is provided in a space between the slide rail posts.

Therefore, an objective of the present invention is to provide an ultrathin three-section slide rail having sufficient strength, wherein a front support and a rear support are fitted in a reinforcing plate and secured at two ends thereof, respectively. The reinforcing plate, in turn, is connected and secured to a main body, thereby sandwiching the front and rear supports therebetween. The main body has one side provided with a ball bearing plate. In addition, a first extension plate is fitted in the main body and the ball bearing plate while a second extension plate is fitted in the first extension plate. The foregoing structure allows the front and rear supports to be adjusted according to a span of slide rail posts in a chassis, so as to extend across the slide rail posts. The slide rail of the aforesaid configuration has an overall thickness of about 5.2 to 5.8 mm.

Another objective of the present invention is to provide a slide rail capable of rapid installation and removal, wherein each of a front support and a rear support of the slide rail has one end thereof formed with a bent section provided with a plurality of threaded holes for mating with specially designed, switchable auxiliary pins. Each of the auxiliary pins has one end formed with a first projection for insertion into one of the threaded holes of the bent sections, and an opposite end formed with a second projection for subsequent, rapid insertion into one of positioning holes of slide rail posts of a chassis, thereby allowing the slide rail to be easily positioned in the desired positioning holes of the slide rail posts and secured in place by fastening screws. Alternatively, the fastening screws can be replaced by resilient fasteners disposed at the bent sections at both ends of the slide rail, so that the resilient fasteners and the auxiliary pins jointly enable rapid installation and removal of the slide rail.

A further objective of the present invention is to use a "space" between slide rail posts to reinforce the load bearing strength of an ultrathin slide rail, thereby furnishing the slide rail with the strength and smoothness of the conventional slide rails.

BRIEF DESCRIPTION OF THE SEVERAL VIEWS OF THE DRAWINGS

The invention as well as a preferred mode of use, further objectives and advantages thereof will be best understood by referring to the following detailed description of an illustrative embodiment in conjunction with the accompanying drawings, wherein:

FIG. 1 is a perspective view of a slide rail according to the present invention;

FIG. 2 is a perspective view of the slide rail according to the present invention, showing a reverse side thereof;

FIG. 3 is a sectional view of the slide rail according to the present invention;

DETAILED DESCRIPTION OF THE INVENTION

Figure 4:
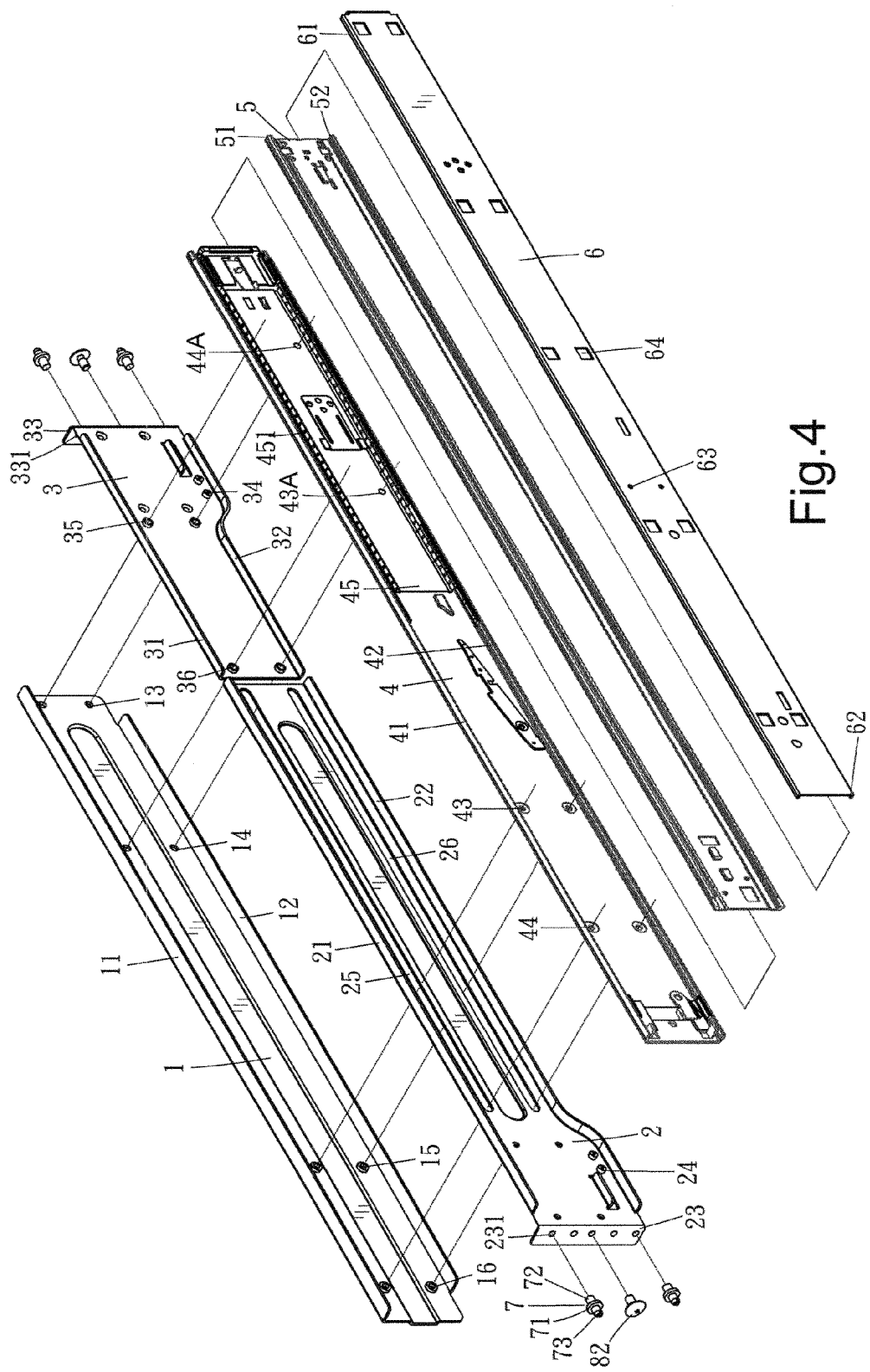
FIG. 4 is an exploded perspective view of the slide rail according to the present invention.

Referring to FIGS. 1 through 4, an ultrathin slide rail capable of rapid installation and removal essentially includes a reinforcing plate 1, a rear support 2, a front support 3, a main body 4, a first extension plate 5, a second extension plate 6 and a plurality of switchable auxiliary pins 7.

The reinforcing plate 1 has an upper edge and a lower edge, each formed with a bent portion 11, 12 bent toward one side of the reinforcing plate 1. The reinforcing plate 1 further has a middle section formed with plural sets of through holes 13, 14, 15 and 16.

The rear support 2 has an upper edge and a lower edge, each formed with a bent portion 21, 22 bent toward one side of the rear support 2. The rear support 2 also has one end formed with a bent section 23 provided with a plurality of threaded holes 231. The rear support 2 further has an inner corner formed with a set of threaded posts 24, and a middle section formed with two slots 25 and 26 corresponding in position to two sets of the plural sets of through holes 15 and 16 of the reinforcing plate 1. During assembly, the rear support 2 is fitted between inner surfaces of the bent portions 11 and 12 of the reinforcing plate 1, before screws or rivets are passed through the through holes 15, 16 and the corresponding slots 25 and 26, thereby securing the rear support 2 to one end of the reinforcing plate 1.

Similarly, the front support 3 has an upper edge and a lower edge, each formed with a bent portion 31, 32 bent toward one side of the front support 3. The front support 3 also has one end formed with a bent section 33 provided with a plurality of threaded holes 331. The front support 3 further has an inner corner formed with a set of threaded posts 34, and a middle section formed with through holes 35 and 36 corresponding in position to another two sets of the plural sets of through holes 13 and 14 of the reinforcing plate 1. During assembly, the front support 3 is fitted between the inner surfaces of the bent portions 11 and 12 of the reinforcing plate 1, before the screws or the rivets are passed through the corresponding through holes 13, 14 and 35, 36 to secure the front support 3 to an opposite end of the reinforcing plate 1.

The main body 4 has an upper edge and a lower edge, each formed with a U-shaped bent portion 41, 42 bent toward one side of the main body 4. The main body 4 is provided with through holes 43A, 44A, 43 and 44 corresponding in position to the four sets of through holes 13, 14, 15 and 16 of the reinforcing plate 1. A ball bearing plate 45 is secured between inner surfaces of the U-shaped bent portions 41 and 42 of the main body 4 and has spaced ball holes 451 each receiving a ball 452 therein. During assembly, the main body 4 is fitted between inner surfaces of the bent portions 21, 22 and 31, 32 of the rear support 2 and the front support 3, respectively, before the screws or the rivets are passed through the through holes 13, 14, 15 and 16, the two slots 25 and 26, and the through holes 35, 36, 43, 44, 43A and 44A, thereby securing the main body 4 to the reinforcing plate 1 and sandwiching the rear support 2 and the front support 3 therebetween. Thus, the rear support 2 can extend or contract by sliding along the reinforcing plate 1 and thus allow a distance between the rear support 2 and the front support 3 to be adjusted according to a span between two slide rail posts 8 of a chassis, so that the slide rail can extend across the slide rail posts 8.

The first extension plate 5 has an upper edge and a lower edge, each formed with a U-shaped bent portion 51, 52 bent toward one side of the first extension plate 5. The first extension plate 5 can slide into the main body 4 through one end thereof and thus be fitted between the U-shaped bent portions 41 and 42 of the main body 4 so as to slide within the main body 4.

The second extension plate 6, configured for securing a host thereon, has an upper edge and a lower edge, each formed with a reinforced flange 61, 62, and a middle section formed with threaded holes 63 or fastening holes 64 through which the host can be secured to the second extension plate 6. The second extension plate 6 can slide into the first extension plate 5 through one end thereof and thus fit between the U-shaped bent portions 51 and 52 of the first extension plate 5 so as to slide within the first extension plate 5.

Referring to FIG. 3, a pair of the ultrathin slide rails having the aforesaid structural features can be secured symmetrically across corresponding slide rail posts 8 of the chassis, with the three sections of each slide rail extended to provide adequate strength and sufficient support for a host connected between the slide rails. The slide rail of the present invention has a much smaller thickness than those of the conventional two- or three-section slide rails.

Figure 5:
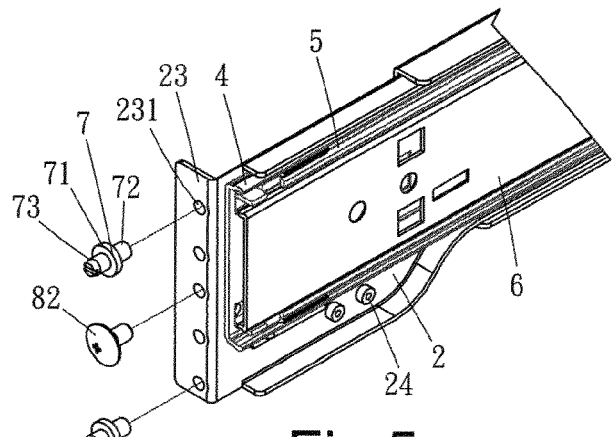
FIG. 5 is an exploded perspective view of the slide rail according to the present invention, showing switchable auxiliary pins and a main body.
Figure 6:
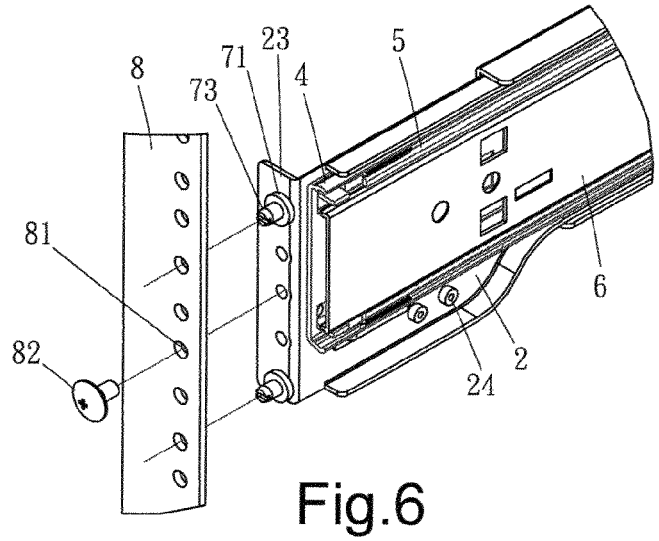
FIG. 6 is an exploded perspective view of the slide rail according to the present invention, showing the switchable auxiliary pins, the main body and a slide rail post of a chassis.
Figure 7:
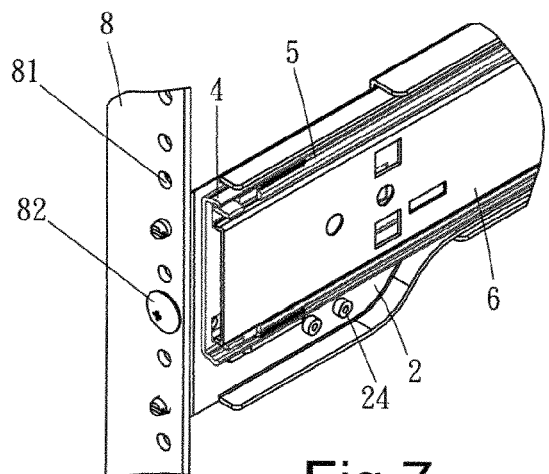
FIG. 7 is a perspective view of the switchable auxiliary pins, the main body and the slide rail post of the chassis in an assembled state.

Reference is now made to FIGS. 5 to 7. The slide rail according to the present invention can have its length adjusted according to the span between the slide rail posts 8 of the chassis by extending or contracting the slidable parts of the slide rail relative to the main body 4, before the slide rail is secured across the slide rails posts 8 in a way that allows rapid installation and removal.

According to the present invention, rapid installation and removal is achieved by using the plurality of specially designed, switchable auxiliary pins 7. Each of the auxiliary pins 7 is centrally formed with a separating wall 71 separating two projections 72 and 73 formed respectively on two ends of each pin 7. Where four such switchable auxiliary pins 7 are used, the slide rail is installed by first inserting the projections 72 at the one ends of the pins 7 into corresponding ones of the threaded holes 231 and 331 on the bent sections 23 and 33 of the rear support 2 and the front support 3, respectively. Then, the rear support 2 and the front support 3 are pulled away from each other toward the two slide rail posts 8 of the chassis, respectively. Following that, the projections 73 at the other ends of the pins 7 are aligned with and inserted into corresponding ones of the through holes 81 of the slide rail posts 8, thereby rapidly positioning the assembled slide rail across the slide rail posts 8. Finally, fastening screws 82 are inserted sequentially through other ones of the through holes 81 of the slide rail posts 8 and other ones of the threaded holes 231 and 331 on the bent sections 23 and 33 of the rear support 2 and the front support 3, respectively, to secure the slide rail fixedly in place.

Figure 8:
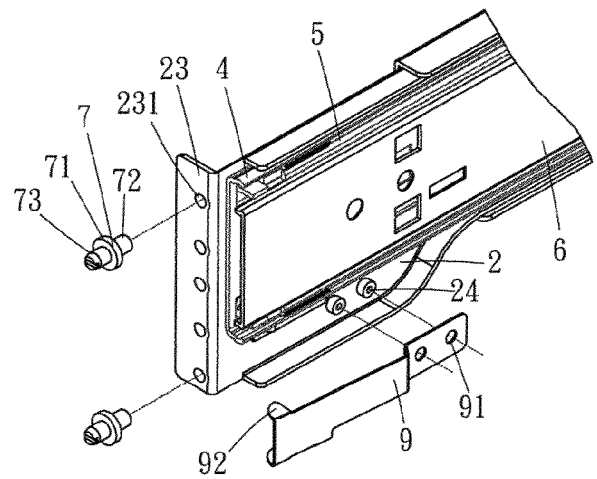
FIG. 8 is an exploded perspective view of the slide rail according to the present invention, showing a resilient fastener and the main body.
Figure 9:
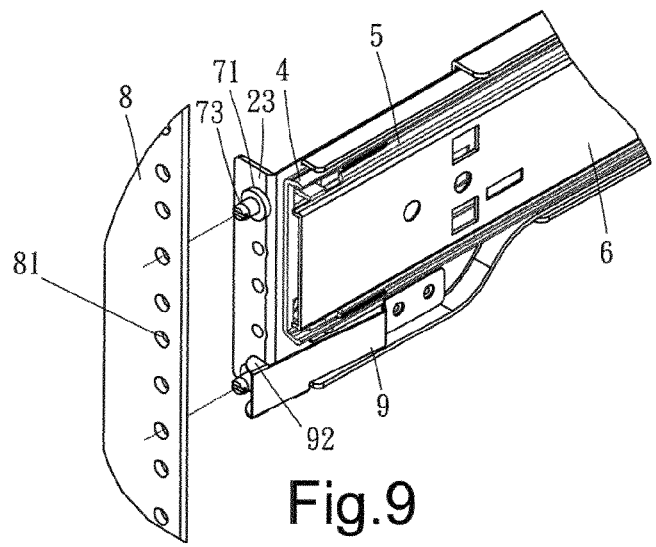
FIG. 9 is an exploded perspective view of the slide rail according to the present invention, showing the resilient fastener, the main body and the slide rail post of the chassis.
Figure 10:
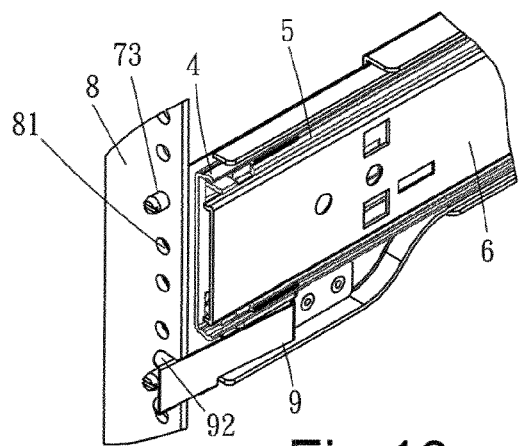
FIG. 10 is a perspective view of the resilient fastener, the main body and the slide rail post in an assembled state.

Referring to FIGS. 8 to 10, the rapid installation and removal according to the present invention is also achievable by using resilient fasteners 9 in place of the aforesaid fastening screws 82. Each of the resilient fasteners 9 has one end formed with through holes 91 and the other end formed as a fastening end 92. The resilient fasteners 9 are secured to the threaded posts 24 and 34 at the inner corners of the rear support 2 and the front support 3, respectively, by screws passing through the through holes 91. To install the slide rail, the switchable auxiliary pins 7 are coupled at the one ends thereof with the rear support 2 and the front support 3. Then, the projections 73 at the other ends of the pins 7 are inserted into the corresponding though holes 81 of the slide rail posts 8. Finally, the rear support 2 and the front support 3 are pulled open, allowing the fastening ends 92 of the resilient fasteners 9 to engage with edges of the slide rail posts 8, respectively. The slide rail is removed by simply pulling the fastening ends 92 out of the engagement with the slide rail posts 8.

In conclusion, the slide rail according to the present invention is specially configured to provide an ultrathin, three-section slide rail mechanism. In addition, the switchable auxiliary pins are inserted into the threaded holes on the bent sections at both ends of the slide rail to enable easy alignment of the slide rail with the positioning holes of the slide rail posts and thereby facilitate rapid installation of the slide rail with the fastening screws. Alternatively, the resilient fasteners can be used in place of the fastening screws to achieve rapid installation and removal of the slide rail.

The invention claimed is:

1. An ultrathin slide rail, comprising:
a reinforcing plate having: an upper edge and a lower edge each formed with a bent portion bent toward one side of the reinforcing plate; and a middle section formed with plural sets of through holes;
a rear support having: an upper edge and a lower edge each formed with a bent portion bent toward one side of the rear support; one end formed with a bent section provided with a plurality of threaded holes; an inner corner formed with a set of threaded posts; and a middle section formed with two slots corresponding in position to two sets of the plural sets of through holes of the reinforcing plate, wherein the rear support is assembled by being fitted between inner surfaces of the bent portions of the reinforcing plate, and then passing screws or rivets through the two sets of through holes of the reinforcing plate and the corresponding slots, thereby securing the rear support to one end of the reinforcing plate;
a front support having: an upper edge and a lower edge each formed with a bent portion bent toward one side of the front support; one end formed with a bent section provided with a plurality of threaded holes; an inner corner formed with a set of threaded posts; and a middle section formed with through holes corresponding in position to another two sets of the plural sets of through holes of the reinforcing plate, wherein the front support is assembled by being fitted between the inner surfaces of the bent portions of the reinforcing plate, and then passing the screws or the rivets through the another two sets of through holes of the reinforcing plate and the corresponding through holes of the front support, thereby securing the front support to an opposite end of the reinforcing plate;
a main body having: an upper edge and a lower edge each formed with a U-shaped bent portion bent toward one side of the main body; through holes corresponding in position to the four sets of through holes of the reinforcing plate; and a ball bearing plate which is secured between inner surfaces of the U-shaped bent portions of the main body and has spaced ball holes each receiving a ball therein, wherein the main body is assembled by being fitted between inner surfaces of the bent portions of the rear support and of the front support, respectively, and then passing the screws or the rivets through the four sets of through holes of the reinforcing plate, the two slots of the rear support, the through holes of the front support and the through holes of the main body, thereby securing the main body to the reinforcing plate and sandwiching the rear support and the front support therebetween, in which the rear support can extend or contract by sliding along the reinforcing plate, allowing a distance between the rear support and the front support to be adjusted according to a span between two slide rail posts of a chassis, so that the slide rail can extend across slide rail posts;
a first extension plate having an upper edge and a lower edge each formed with a U-shaped bent portion bent toward one side of the first extension plate, wherein the first extension plate can slide into the main body through one end thereof and thus fit between the U-shaped bent portions of the main body so as to slide within the main body; and
a second extension plate configured for securing a host thereon, wherein the second extension plate has: an upper edge and a lower edge each formed with a reinforced flange; and a middle section formed with threaded holes or fastening holes and configured so that, when the host is secured to the second extension plate, the host is secured to the second extension plate through the threaded holes or the fastening holes, in which the second extension plate can slide into the first extension plate through one end thereof and thus fit between the U-shaped bent portions of the first extension plate so as to slide within the first extension plate.

2. A slide rail capable of rapid installation and removal, wherein the slide rail has two ends formed with either a rear support or a front support, each having a bent section provided with a plurality of switchable auxiliary pins, each said switchable auxiliary pin being centrally formed with a separating plate separating projections formed respectively on two ends of each said pin,
wherein resilient fasteners are configured for securing the switchable auxiliary pins to slide rail posts, wherein the resilient fasteners each having one end formed with through holes and an opposite end formed as a fastening end, the resilient fasteners being secured to threaded posts formed at corners of the slide rail, respectively, by screws passing through the through holes of the resilient fasteners, in which the slide rail is configured to installed by:
coupling the switchable auxiliary pins at the one ends thereof with the bent sections of the slide rail; inserting the projections at the other ends of the pins into the corresponding ones of through holes of the slide rail posts; and pulling open the rear support and the front support to engage the fastening ends of the resilient fasteners with edges of the slide rail posts; and in which the slide rail is removed by pulling the fastening ends out of the engagement with the slide rail posts.

* * * * *